US012606371B2

(12) United States Patent
Kobayashi

(10) Patent No.: US 12,606,371 B2
(45) Date of Patent: Apr. 21, 2026

(54) OVERHEAD TRAVELING CARRIER WITH LEFT AND RIGHT ARMS AND SUPPORTS

(71) Applicant: MURATA MACHINERY, LTD., Kyoto (JP)

(72) Inventor: Makoto Kobayashi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 235 days.

(21) Appl. No.: 18/575,102

(22) PCT Filed: Mar. 11, 2022

(86) PCT No.: PCT/JP2022/011035
§ 371 (c)(1),
(2) Date: Dec. 28, 2023

(87) PCT Pub. No.: WO2023/281827
PCT Pub. Date: Jan. 12, 2023

(65) Prior Publication Data
US 2024/0300736 A1 Sep. 12, 2024

(30) Foreign Application Priority Data
Jul. 8, 2021 (JP) ................................. 2021-113319

(51) Int. Cl.
*B65G 1/04* (2006.01)
*H01L 21/677* (2006.01)
*H10P 72/30* (2026.01)

(52) U.S. Cl.
CPC ......... *B65G 1/0464* (2013.01); *B65G 1/0457* (2013.01); *H10P 72/3221* (2026.01)

(58) Field of Classification Search
CPC ................ B65G 1/0464; B65G 1/0457; H01L 21/67733; H10P 72/3221
See application file for complete search history.

(56) References Cited

U.S. PATENT DOCUMENTS

| | | | | | |
|---|---|---|---|---|---|
| 1,833,179 | A | * | 11/1931 | Robins .................... | B65G 39/04 |
| | | | | | 384/417 |
| 7,464,823 | B2 | * | 12/2008 | Nakao ..................... | B66C 13/06 |
| | | | | | 212/331 |
| 10,822,205 | B2 | * | 11/2020 | Kobayashi .............. | B66C 11/00 |
| 2019/0241406 | A1 | * | 8/2019 | Kobayashi .............. | B65G 1/04 |
| 2024/0002148 | A1 | * | 1/2024 | Kobayashi ........ | H01L 21/67733 |

FOREIGN PATENT DOCUMENTS

| | | | | | |
|---|---|---|---|---|---|
| EP | | 1612182 | A1 | * | 1/2006 ............. B66C 13/06 |
| WO | | 2018/079146 | A1 | | 5/2018 |

* cited by examiner

*Primary Examiner* — Gerald McClain
(74) *Attorney, Agent, or Firm* — Keating & Bennett, LLP

(57) ABSTRACT

An overhead transport vehicle includes a lifter to be raised and lowered by a plurality of suspensions on left and right sides. The lifter includes a base portion, a left support and a right support attached to lower ends of the suspensions and each supporting the base portion via an elastic body, and a left arm and a right that are respectively bridged between the left support and the base portion and between the right support and the base portion, and each including a first end attached to each of the left support and the right support via a first rotation shaft and a second end attached to the base portion via a second rotation shaft.

4 Claims, 12 Drawing Sheets

1

3A    3    2

5

6

7

8

8   9

9   15   11   12   95   13

8   10   12   13

REAR     FRONT

90

8B     8B 8A     8A

REAR

REAR

10B

20

22

49B 32b
39B

26

44

45

25

34
35

41B { 42
43
46

33 } 31
32

RIGHT

37

LEFT

47

38a

48a

30

45

35

34

44

38

24

39A

48

38b

49A

32a

40B

50B

52

51

52  21

FRONT

Z ⊙ → Y
↓
X

OVERHEAD TRAVELING CARRIER WITH LEFT AND RIGHT ARMS AND SUPPORTS

BACKGROUND OF THE INVENTION

1. Field of the Invention

The present disclosure relates to overhead transport vehicles.

2. Description of the Related Art

Conventionally, as described in International Publication No. WO 2018/079146, an overhead transport vehicle including a main body that can travel along a track and a lifting unit configured to be raised and lowered by a suspension member with respect to the main body is known. The lifting unit has a gripping portion configured to grip an article. The base portion with the gripping portion is supported by a support. The support is attached to a lower end of the suspension member and is raised and lowered by the suspension member. A spring member is provided between the base portion and the support.

SUMMARY OF THE INVENTION

In a structure described in International Publication No. WO 2018/079146, the spring member functions as a vibration isolator and reduces vibrations transmitted between members that are in contact with each other. However, in this structure, a plurality of spring members, shaft members, and supports are provided for one suspension member, which tends to make a configuration more complicated.

This disclosure describes overhead transport vehicles that each allow a simplified configuration to reduce or prevent a vibration at a base portion.

One aspect of an example embodiment of the present disclosure is an overhead transport vehicle including a lifter to be raised and lowered by a plurality of suspensions on left and right sides, wherein the lifter includes a base portion, a left support and a right support attached to lower ends of the suspensions and located on the left and right sides, the left support and the right support each supporting the base portion via an elastic body, and a left arm and a right arm that are respectively bridged between the left support and the base portion and between the right support and the base portion, and each including a first end attached to each of the left support and the right support via a first rotation shaft and a second end attached to the base portion via a second rotation shaft.

With this overhead transport vehicle, the left support and the right supports on the left and right of the base portion, are suspended by the suspensions and support the base portion. With the first rotation shafts respectively provided on first ends of the left arm and the right arm, the left support and the right support are rotatable with respect to the left support and the right support, respectively. The base portion is rotatable with respect to the left arm and the right arm while extending and retracting the elastic body via the second rotation shaft provided on the second end of each of the left arm and the right arm. As a result, the base portion is swingable via the left arm and the right arm. The elastic body is provided between the base portion and each of the left support and the right support, thus reducing or preventing vibration in the base portion. Compared to conventional structures, the number of elastic bodies (e.g., spring members or the like) can be reduced, and vibration at the base portion can be reduced or prevented with a simple configuration.

The second end of the left arm and the second end of the right arm may be attached to the base portion via the second rotation shaft that is common thereto. With this configuration, the base portion is connected to the left support and the right support by the left arm, the right arm, and the second rotation shaft that is provided between those structures and is common thereto. The left arm, the right arm, and the second rotation shaft define a connection structure having a C shape in plan view, and thus a posture of the base portion can be more stable.

The second rotation shaft may include a rubber bush as a bearing. With this configuration, vibration damping properties can be provided in the left arm and the right arm.

A support position at which the base portion is supported via the elastic body may be different in plan view from suspension positions at which the left support and the right support are suspended by the suspensions. With this configuration, the support position on which the elastic body is provided can be shifted from the suspension position, which can make the lifter compact in its height direction.

A number of support positions at which the base portion is supported via the elastic body may be the same as or less than a number of suspension positions at which the left support and the right support are suspended by the suspensions. With this configuration, the number of support positions (i.e., the number of elastic bodies) can be reduced to a minimum necessary, and the configuration can be further simplified.

With the overhead transport vehicles according to example embodiments of the present disclosure, vibration in the base portion is reduced or prevented with a simple configuration.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Example embodiments of the present invention will now be described in detail with reference to the drawings. In description of the drawings, like elements are designated by like reference signs, and duplicate description is omitted.

Figure 1:
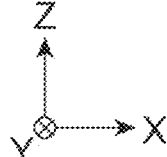
FIG. 1 is a side view illustrating an overhead transport vehicle according to an example embodiment of the present invention.

First, an overall structure of the overhead transport vehicle will now be described with reference to FIG. 1. An overhead transport vehicle 1 illustrated in FIG. 1 is capable of traveling along a traveling rail 2 installed at a location higher than a floor, such as on a ceiling of a clean room. The overhead transport vehicle 1 transports a front opening unified pod (FOUP) (article) 90 as an article between a storage facility and a predetermined load port, for example. The FOUP 90 accommodates a plurality of semiconductor wafers, reticles, or the like, for example. The FOUP 90 includes a flange 95 to be held by the overhead transport vehicle 1.

In the following description, for convenience of explanation, the right-and-left direction (X-axis direction) in FIG. 1 is defined as a front-and-rear direction of the overhead transport vehicle 1. The up-and-down direction in FIG. 1 is defined as an up-and-down (vertical) direction (Z-axis direction) of the overhead transport vehicle 1. A depth direction in FIG. 1 is defined as a right-and-left direction or a width direction (Y-axis direction) of the overhead transport vehicle 1. The X-axis, the Y-axis, and the Z-axis are orthogonal to each other. In this specification, with respect to the illustration of the overhead transport vehicle 1 (including each part of the overhead transport vehicle 1), a view viewed from the traveling direction of the overhead transport vehicle 1, i.e., the X-axis direction, is a front view.

As illustrated in FIG. 1, the overhead transport vehicle 1 includes a traveling drive unit 3, a horizontal drive unit 5, a rotary drive unit 6, a lifting drive unit 7, a lifting unit 10 (lifter), and a gripping portion 11. The horizontal drive unit 5, the rotary drive unit 6, and the lifting drive unit 7 define the main body that can move along the traveling rail 2. To the overhead transport vehicle 1, a pair of covers 8, 8 are provided on its front-and-rear direction so as to cover the horizontal drive unit 5, the rotary drive unit 6, the lifting drive unit 7, the lifting unit 10, and the gripping portion 11. The pair of covers 8, 8 define a space to accommodate the FOUP 90 below the gripping portion 11 in a state in which the lifting unit 10 has ascended to its ascending end. A fall-preventing mechanism 8A prevents the FOUP 90 held by the gripping portion 11 from falling in a state in which the lifting unit 10 has ascended to its ascending end. A swaying suppression mechanism 8B suppresses swaying of the FOUP 90 held by the gripping portion 11 in the front-and-rear direction (traveling direction) and the right-and-left direction of the overhead transport vehicle 1 during traveling.

The traveling drive unit 3 moves the overhead transport vehicle 1 along the traveling rail 2. The traveling drive unit 3 is disposed inside the traveling rail 2. The traveling drive unit 3 drives a roller (not illustrated) to travel on the traveling rail 2. Below the traveling drive unit 3, the horizontal drive unit 5 is provided with a shaft 3A interposed therebetween. The horizontal drive unit 5 moves the rotary drive unit 6, the lifting drive unit 7, and the lifting unit 10 in a direction orthogonal to an extending direction of the traveling rail 2 (right-and-left direction) in a horizontal plane. The rotary drive unit 6 rotates the lifting drive unit 7 and the lifting unit 10 in a horizontal plane.

The lifting unit 10 (lifter) is capable of being raised and lowered by the lifting drive unit 7, and functions as a lifting platform in the overhead transport vehicle 1. The lifting drive unit 7 raises and lowers the lifting unit 10 by winding and paying out three belts (suspensions) 9. The lifting unit 10 is raised and lowered with respect to the main body described above by the three belts. A plurality of belts 9 (for example, 3 in this example embodiment) are provided on the left and right. In the present example embodiment, two of the three belts 9 are disposed on the left side and one on the right side. The suspension is not limited to the belt 9, but other members such as wires and ropes may be used.

Figure 4:
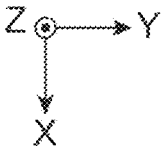
FIG. 4 is a plan view of a lifting unit according to the overhead transport vehicle of the first example embodiment of the present invention.
Figure 5:
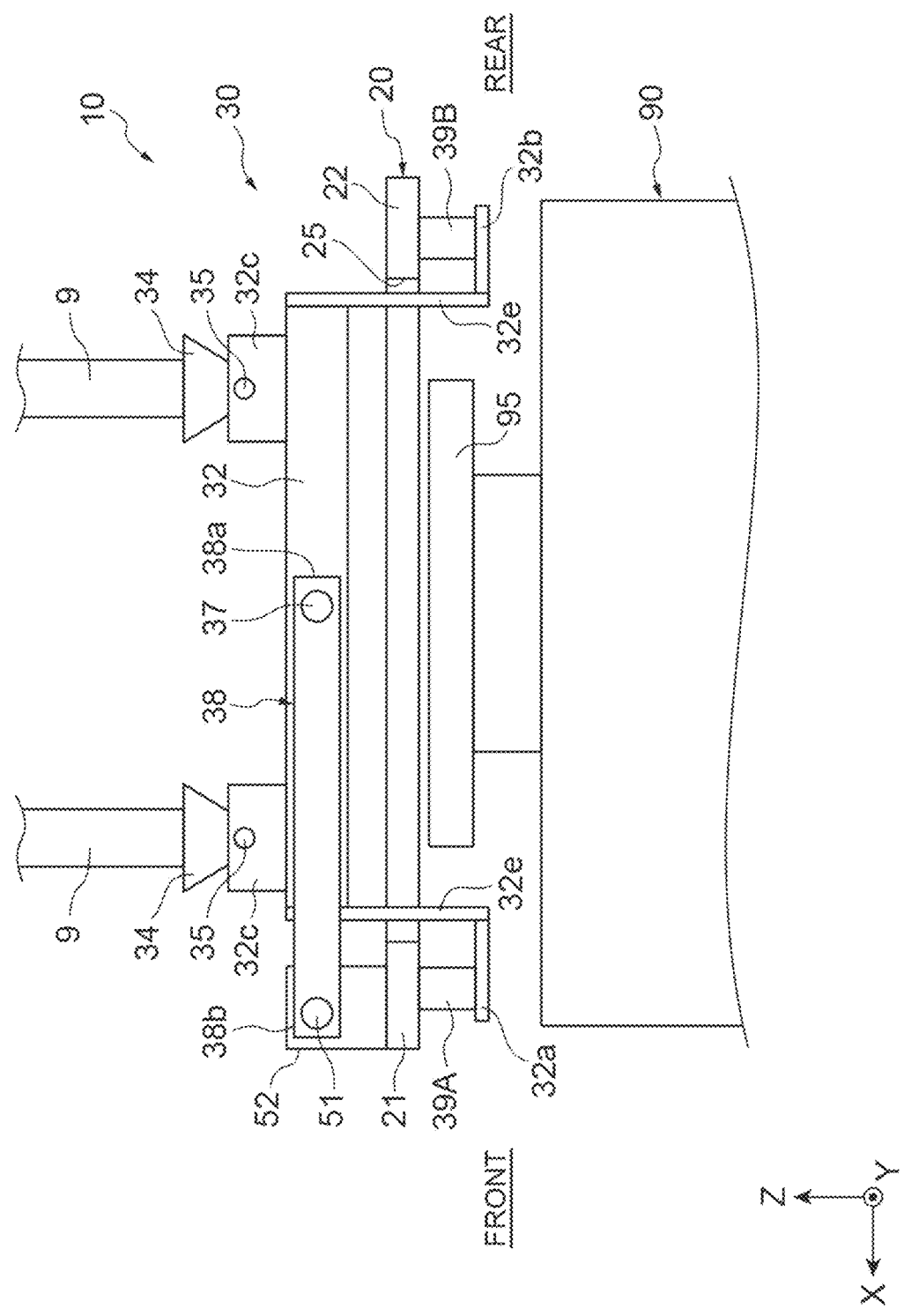
FIG. 5 is a right side view of the lifting unit of FIG. 4.
Figure 6:
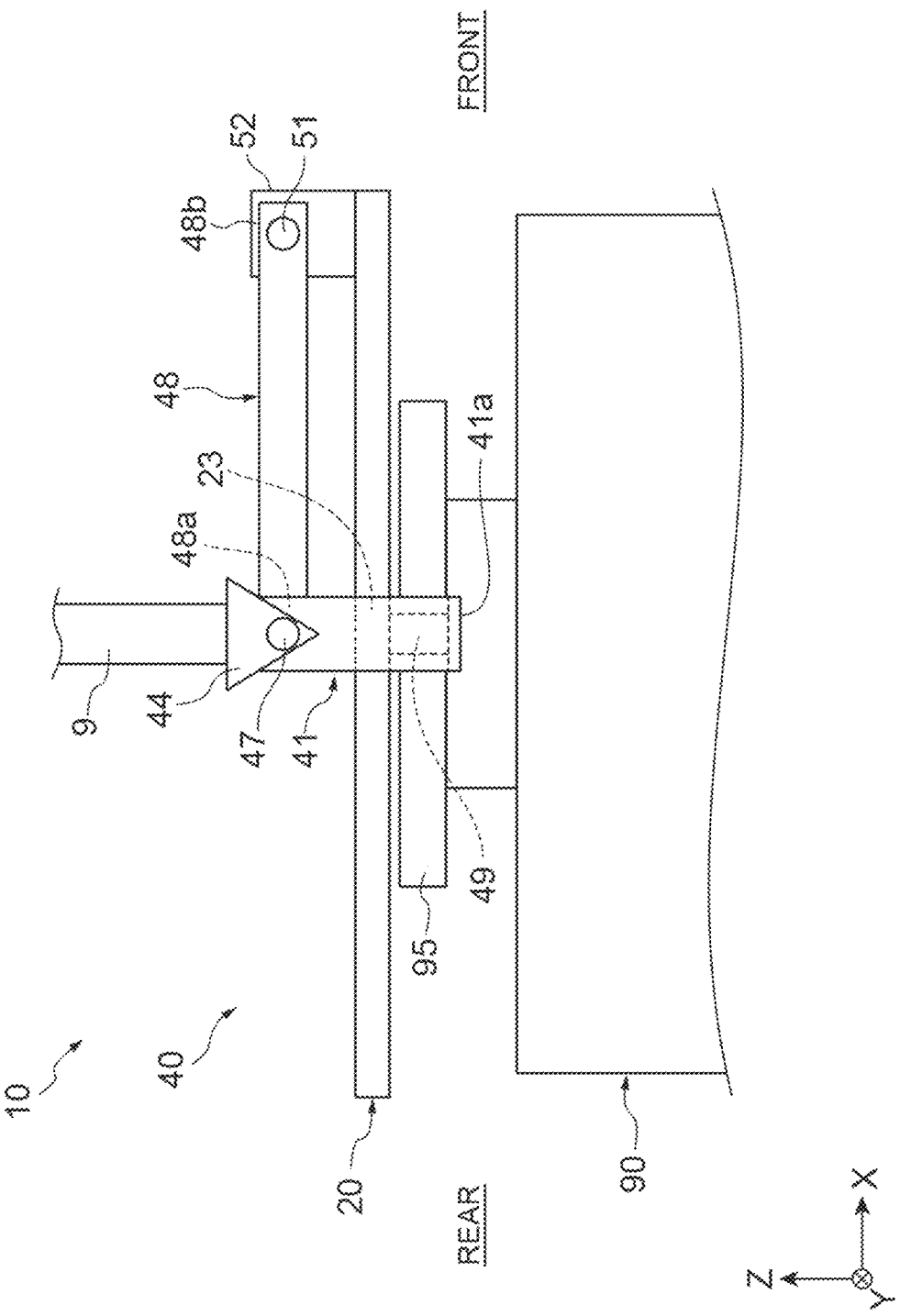
FIG. 6 is a left side view of the lifting unit of FIG. 4.

The lifting unit 10 (lifter) includes a left vibration isolation mechanism (first vibration isolation mechanism) 30 and a right vibration isolation mechanism (second vibration isolation mechanism) 40 to which the three belts 9 are attached, and a base portion 20 to which the gripping portion 11 is provided (refer to FIGS. 4 to 6). The gripping portion 11 grips (or holds) the FOUP 90. The gripping portion 11 includes a pair of arms 12, 12 having an L shape, hands 13, 13 fixed to the respective arms 12, 12, and an opening/closing mechanism 15 configured to open and close the pair of arms 12, 12. The pair of arms 12, 12 and the opening/closing mechanism 15 are attached to the base portion 20.

The pair of arms 12, 12 are provided to the opening/closing mechanism 15. The opening/closing mechanism 15 moves the pair of arms 12, 12 in a direction coming closer to each other and in a direction separating apart from each other. By operation of the opening/closing mechanism 15, the pair of arms 12, 12 are moved in the front-and-rear direction. By this operation, the pair of hands 13, 13 fixed to the arms 12, 12 are opened and closed. In the present example embodiment, the height position of the gripping portion 11 (the lifting unit 10) is adjusted such that a holding surface of each of the hands 13 is positioned lower than a height of a lower surface of the flange 95 when a pair of hands 13, 13 are in an open state. In this state, when the pair of hands 13, 13 are brought into a closed state, the holding surfaces of the hands 13, 13 are moved forward below the lower surface of the flange 95, and the lifting unit 10 is raised in this state, so that the flange 95 is held (gripped) by the pair of hands 13, 13, and the FOUP 90 is supported.

The left vibration isolation mechanism 30 and the right vibration isolation mechanism 40 include cushioning mechanisms in the lifting unit 10 and function as stabilizers for the overhead transport vehicle 1. The configuration of the left vibration isolation mechanism 30 and the right vibration isolation mechanism 40 will be described in detail later.

Figure 2:
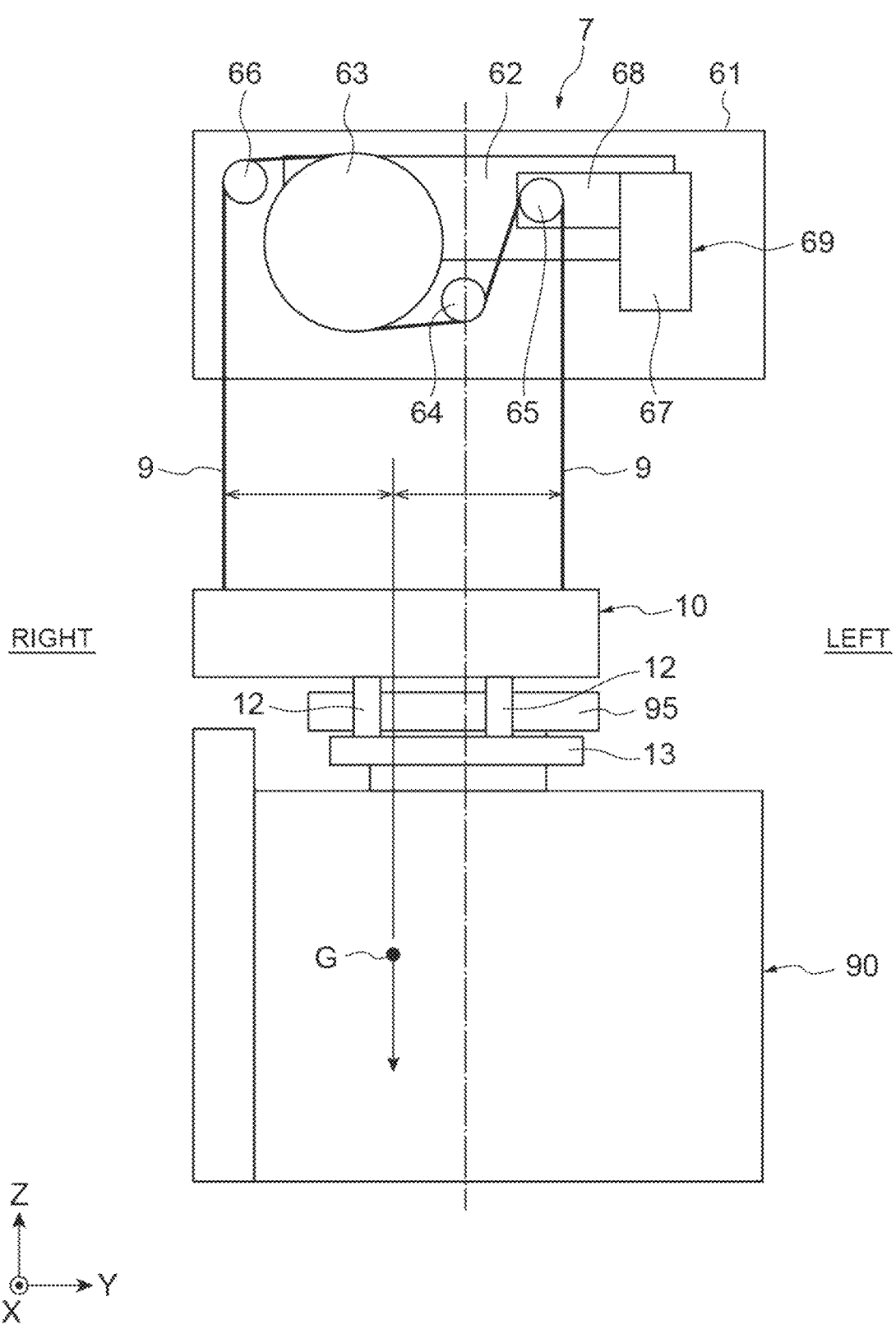
FIG. 2 is a front view illustrating a schematic configuration of an inside of a lifting drive unit.
Figure 3:
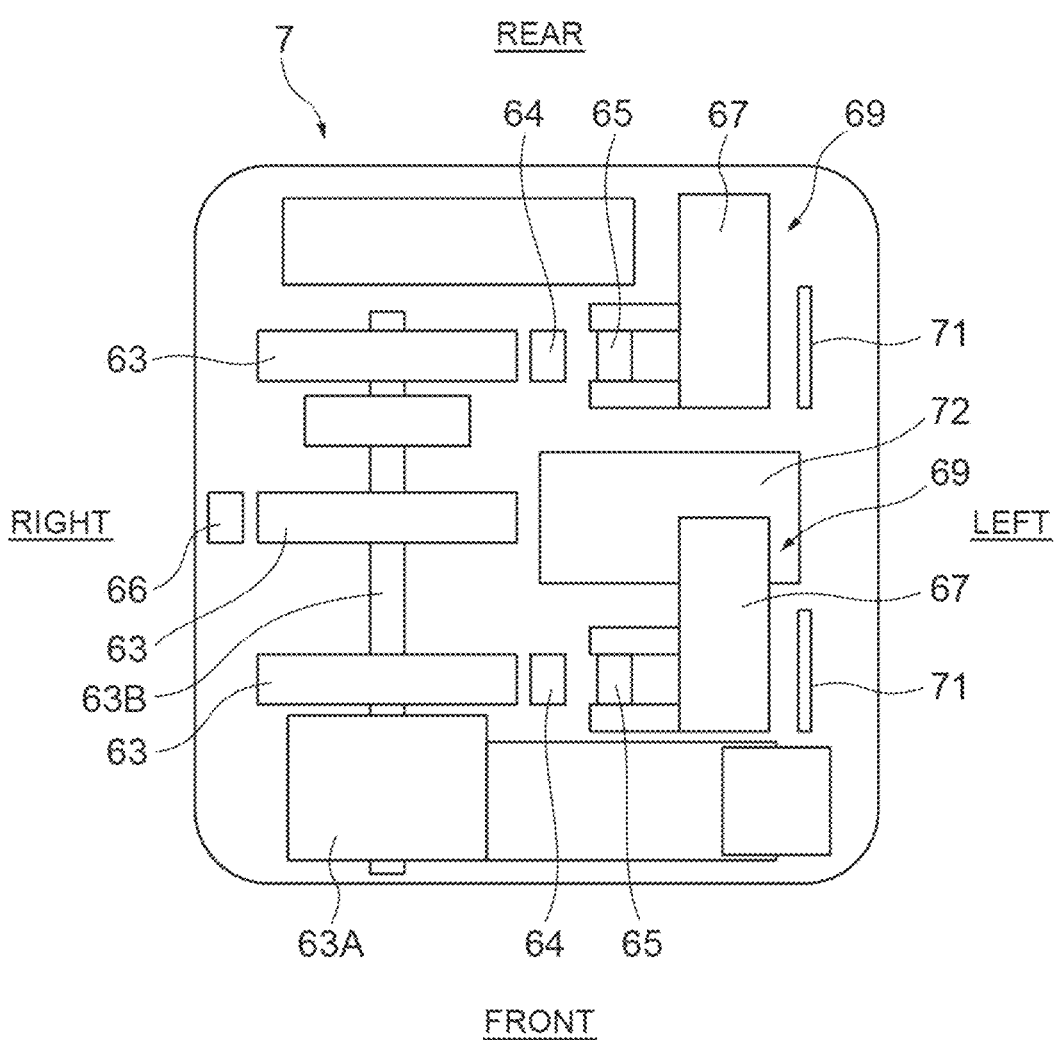
FIG. 3 is a plan view illustrating a schematic configuration of the inside of the lifting drive unit.
Figure 3:
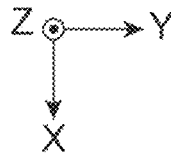

Referring now to FIGS. 2 and 3, the configuration of the lifting drive unit 7 is explained. FIG. 2 is a front view of the inside of the lifting drive unit 7, and FIG. 3 is a plan view of the inside of the lifting drive unit 7. As illustrated in FIGS. 2 and 3, the lifting drive unit 7 includes a main frame 61, a support 62, a plurality of (for example, three) winding drums 63, a first idler roller 64, a second idler roller 65, a third idler roller 66, an idler adjustment mechanism 69 including an actuator 67 and an oscillating member 68, and three belts (suspensions) 9.

The main frame 61 is suspended and supported by the traveling drive unit 3. The main frame 61 supports the winding drums 63, the first idler rollers 64 via the support 62. The support 62 rotatably supports the three winding drums 63. One end of each of the belts 9 is connected to the gripping portion 11, and the other end of the belt 9 is connected to the corresponding winding drum 63. The three winding drums 63 are arranged in the front-and-rear direction, and wind or pay out the respective three belts 9 by being driven by the drive motors 63A. Each of the winding drums 63 is attached to the main frame 61 via the support 62 so as to be rotatable. The drive motor 63A is a driving source to rotate each of the winding drums 63, and is fixed to the main frame 61. The three winding drums 63 are driven by the drive motor 63A by being attached to a rotation shaft 63B (refer to FIG. 3) that is common thereto. The three winding drums 63 may be connected by an interlocking mechanism, which is not illustrated, and driven by the drive motor 63A.

As illustrated in FIG. 3, the lifting drive unit 7 includes two idler adjustment mechanisms 69 for two pairs of the first idler roller 64 and the second idler roller 65 (i.e., the two belts 9 on the left side) on the front side and the rear side. The two idler adjustment mechanisms 69 are disposed on the left side in the main frame 61. The lifting drive unit 7 includes two control boards 71 for rotational adjustment and one control board 72 for horizontal adjustment. The control boards 71 for rotational adjustment and the control board 72 for horizontal adjustment are disposed on the left side in the main frame 61.

In the lifting drive unit 7 of the present example embodiment, using the three belts 9 enables reduction of the weight compared to a case of having four belts. For one belt 9, components and equipment such as clamps or winding drums are required, but the weight of these components and equipment is reduced. With the drive motor 63A being disposed on the front side, the center of gravity of the lifting drive unit 7 is closer to the front. As a result, floating of the overhead transport vehicle 1 during deceleration is reduced or prevented. Because a floating phenomenon of the overhead transport vehicle 1 is more remarkable during deceleration than during acceleration, shifting the center of gravity forward is advantageous.

In addition, because the idler adjustment mechanism 69 is disposed on the left side, the center of gravity of the lifting drive unit 7 would be biased to the left side if the arrangement were the same as before. Therefore, positioning of the center of gravity of the lifting drive unit 7 is improved by disposing the winding drum 63, the idler roller and the idler adjustment mechanism 69, and the like illustrated in FIG. 2 are entirely located closer to the right side. Specifically, an improvement is embodied such that the center of gravity G of the FOUP 90 is located farther rightward than the center of the FOUP 90 in the right-and-left direction (indicated by a single dotted line in FIG. 2), and the left and right belts 9, 9 are not positioned an equal distance away from this center, but an equal distance away from the center of gravity G, whereby the loads onto the belts 9 do not become unbalanced.

The left vibration isolation mechanism 30 and the right vibration isolation mechanism 40 are then described in detail with reference to FIGS. 4 through 6. The three belts 9 are provided to suspend three points of the lifting unit 10. As illustrated in FIGS. 4 and 5, the left portion of the base portion 20 is suspended from the lower ends of the two belts 9 on the left side via the left vibration isolation mechanism 30. As illustrated in FIGS. 4 and 6, the right portion of the base portion 20 is suspended from the lower end of the one belt 9 on the right side via the right vibration isolation mechanism 40. In the right side view and the left side view in and after FIG. 5, an illustration of the gripping portion 11 is omitted, and the positional relationship of the lifting unit 10 to the FOUP 90 gripped by the gripping portion 11 is illustrated.

As illustrated in FIG. 4, the base portion 20 has a rectangular or substantially rectangular plate shape, for example. The left vibration isolation mechanism 30 is provided on the left side of the base portion 20, and the right vibration isolation mechanism 40 is provided on the right side of the base portion 20. The left vibration isolation mechanism 30 and the right vibration isolation mechanism 40, respectively, extend generally in the front-and-rear direction (i.e., in the traveling direction).

As illustrated in FIGS. 4 and 5, the left vibration isolation mechanism 30 includes a left support 31 attached to the lower ends of the two belts 9 and disposed on the left side of the base portion 20. The lower end of each of the belts 9 is connected to the left support 31 via a clamp 34. The left support 31 includes an outer member 32 and an inner member 33, which face parallel to each other in the right-and-left direction and extend in the front-and-rear direction. The outer member 32 and inner member 33 are made of metal, for example, and can be considered a rigid body. The outer member 32 includes two connecting portions 32c corresponding to the location of each of the belts 9, and the inner member 33 includes two connecting portions corresponding to the location of each of the belts 9 (the connecting portions of the inner member 33 are hidden and not visible in FIG. 5). The lower end of each of the belts 9 is connected to the connecting portion 32c of the outer member 32 and the connecting portion of the inner member 33 via a clamp 34 and a connecting shaft 35 extending in the right-and-left direction.

An opening 25 of a rectangular or substantially rectangular shape is provided in the left side of the base portion 20. The opening 25 is through in the up-and-down direction and open toward the left. The left support 31 is disposed at a position of the opening 25 in plan view. The base portion 20 includes a left front end 21 located in front of the opening 25 and a left rear end 22 located behind the opening 25.

While most of the left support 31, including the connecting portion 32c, is disposed on the base portion 20, the outer member 32 includes a pair of hanging portions 32e, 32e of front and rear that hang downward. The hanging portions 32e, 32e are disposed in the opening 25 and traverse base portion 20. The lower ends of the hanging portions 32e, 32e are below the base portion 20. The lower ends of the hanging portions 32e, 32e, are provided with a left front support plate 32a and a left rear support plate 32b that extend horizontally (in the right-and-left direction and the front-and-rear direction).

The left front support plate 32a faces the left front end 21 of the base portion 20 in the up-and-down direction, and a left front elastic body 39A is interposed between the left front support plate 32a and the left front end 21. The left rear support plate 32b faces the left rear end 22 of the base portion 20 in the up-and-down direction, and a left rear elastic body 39B is interposed between the left rear support plate 32b and the left rear end 22. The left front elastic body 39A and the left rear elastic body 39B are, for example, rubber with the same elasticity (e.g., modulus of elasticity) and have, for example, a cylindrical shape. The left front elastic body 39A and left rear elastic body 39B may be springs.

As illustrated in FIGS. 4 and 6, the right vibration isolation mechanism 40 includes a right support 41 attached to the lower end of the one belt 9 and disposed on the right side of the base portion 20. The lower end of the belt 9 is connected to the right support 41 via the clamp 34. The right support 41 is provided on the central portion of the base portion 20 in a front-and-rear direction, corresponding to the position of the belt 9, and extends in the up-and-down direction. The right support 41 is made of metal, for example, and can be considered a rigid body. The lower end of the belt 9 is connected to the right support 41 via clamps 44 and a right rotation shaft 47 extending in the right-and-left direction.

The upper end of the right support 41 with the right rotation shaft 47 is disposed on the base portion 20, but the right support 41 traverses the base portion 20 at the side of the base portion 20. The lower end of the right support 41 is below the base portion 20. The lower end of the right support 41 is provided with a right support plate 41a that extends horizontally (in the right-and-left direction and the front-and-rear direction).

The right support plate 41a faces a right central portion 23 of the base portion 20 in the up-and-down direction, and a right elastic body 49 is interposed between the right support plate 41a and the right central portion 23. The right elastic body 49 is a rubber having the same elasticity (e.g., modulus of elasticity) as the left front elastic body 39A and left rear elastic body 39B of the left vibration isolation mechanism 30, and has, for example, a cylindrical shape. The right elastic body 49 may be a spring.

Thus, the left support 31 in the left vibration isolation mechanism 30 supports the base portion 20 via the left front elastic body 39A and left rear elastic body 39B, while the right support 41 in the right vibration isolation mechanism 40 supports the base portion 20 via the right elastic body 49.

Furthermore, as illustrated in FIGS. 4 and 5, the left vibration isolation mechanism 30 includes a left arm 38 that is bridged between the left support 31 and the base portion 20 and extends in the front-and-rear direction. The left arm 38 is made of metal, for example, and can be considered a rigid body. The left arm 38 is parallel to the left support 31 and has a length corresponding to the front half of the base portion 20. A first end 38a on the rear side of the left arm 38 is attached to the left support 31 via a left rotation shaft (first rotation shaft) 37 that extends in the right-and-left direction. The left arm 38 is a swing arm that is rotatable around the left rotation shaft 37. The left rotation shaft 37 passes through the outer member 32 and inner member 33, and the first end 38a of the left arm 38. The outer member 32, inner member 33, and left arm 38 are rotatable around the left rotation shaft 37. The left rotation shaft 37, which is a cantilevered shaft, has a predetermined rigidity.

As illustrated in FIGS. 4 and 6, the right vibration isolation mechanism 40 includes a right arm 48 that is bridged between the right support 41 and the base portion 20 and extends in the front-and-rear direction. The right arm 48 is made of metal, for example, and can be considered a rigid body. The right arm 48 has a length corresponding to the front half of the base portion 20. A first end 48a on the rear side of the right arm 48 is attached to the right support 41 via the right rotation shaft (first rotation shaft) 47 that extends in the right-and-left direction. The right arm 48 is a swing arm that is rotatable around the right rotation shaft 47. The right rotation shaft 47 passes through the right support 41 and the clamp 44, and the first end 48a of the right arm 48. The right support 41 and the right arm 48 are rotatable around the right rotation shaft 47. The right rotation shaft 47, which is a cantilevered shaft, has a predetermined rigidity.

As illustrated in FIG. 4, a second end 38b on the front side of the left arm 38 and a second end 48b on the front side of the right arm 48 are attached to the base portion 20 via a front rotation shaft (second rotation shaft) 51 that extends in the right-and-left direction. That is, the second end 38b on the front side of the left arm 38 and the second end 48b on the front side of the right arm 48 are attached to the base portion 20 via the front rotation shaft 51 that is common thereto. The left arm 38 and the right arm 48, for example, firmly fixed to the front rotation shaft 51 and are not rotatable around the front rotation shaft 51.

Rubber bushes 52 as bearings are provided to two locations in the front rotation shaft 51, one of which is near the second end 38b of the left arm 38 and the other is near the second end 48b of the right arm 48. These rubber bushes 52 incorporate a rubber of a cylindrical shape and are configured to receive an axial load of the front rotation shaft 51 on an inner circumference of the rubber. The rubber bush 52 defines a rotary axis by torsion of the rubber. A general rotary bearing may be used in place of the bearing defined by the rubber bush 52. The rubber bush 52 is a damper.

The left vibration isolation mechanism 30 and the right vibration isolation mechanism 40 with the above configuration may have a configuration in which degrees of freedom of rotation around the left rotation shaft 37 and the right rotation shaft 47 are different from each other. In the left vibration isolation mechanism 30, the support structure, via the left support 31, and the left front elastic body 39A and the left rear elastic body 39B as two elastic bodies, makes free rotation around the left rotation shaft 37 difficult. On the other hand, the right vibration isolation mechanism 40 allows free rotation around the right rotation shaft 47 due to the support structure via the right support 41 and the right elastic body 49 as one elastic body. As a result, swaying (swing with the Y direction as an axis) caused by acceleration or deceleration of the overhead transport vehicle 1 is moderately allowed.

On the other hand, the left arm 38, the front rotation shaft 51, and the right arm 48 define a connection structure 50 that is rigid and has a C shape in plan view. In the connection structure 50, the left arm 38 that is a left swing arm, and the right arm 48 that is a right swing arm are fixed coaxially, such that the function of the stabilizer is achieved. At this time, the left and right elastic bodies shrink by the same amount. The rubber bush 52 allows the left arm 38 and the right arm 48 to have damping properties and have elasticities in any of the X, Y and Z directions.

The overhead transport vehicle 1 of the present example embodiment allows the belt 9 to suspend the left support 31 and the right support 41 defining and functioning as supports on the left and right of the base portion 20, thus allowing the left support 31 and the right support 41 to support the base portion 20. With the left rotation shaft 37 and the right rotation shaft 47 provided to the first end 38a of the left arm 38 and the first end 48a of the right arm 48, the left arm 38 and the right arm 48 are rotatable with respect to the left support 31 and the right support 41, respectively. The base portion 20 is slightly rotatable with respect to the left arm 38 and the right arm 48 while extending and retracting the elastic body via the front rotation shaft 51 provided on the second ends 38b, 48b of the left arm 38 and the right arm 48. As a result, the base portion 20 is swingable via the left arm 38 and the right arm 48. The elastic body is provided between the base portion 20 and each of the left support 31 and the right support 41, thus reducing or preventing vibration in the base portion 20. Compared to conventional structures, the number of elastic bodies (e.g., rubber, or springs or the like) can be reduced, and vibration at the base portion 20 can be reduced or prevented with a simple configuration.

With the configuration including the front rotation shaft 51 that is common, the base portion 20 is connected to the left support 31 and the right support 41 by the left arm 38, the right arm 48, and the front rotation shaft 51 that is provided between those members and is common thereto. The left arm 38, right arm 48, and the front rotation shaft 51 define a connection structure having a C shape in plan view, and thus a posture of the base portion 20 can be more stable.

The front rotation shaft 51 that is common is provided with the rubber bushes 52 as bearings. With this configuration, vibration damping properties can be provided in the left arm 38 and right arm 48.

The support position at which the base portion 20 is supported via the elastic body is different in plan view from both the suspension positions in which the left support 31 and the right support 41 are suspended by the belt 9. With this configuration, the support position at which the elastic body is provided can be shifted away from the belt 9, and thus the lifting unit 10 can be more compact in the height direction.

The number of support positions (for example, three in the above example embodiment) at which the base portion 20 is supported via the elastic body is the same as the number of suspension positions (for example, three in the above example embodiment) at which the left support 31 and right support 41 are suspended by the belts 9. With this configuration, the number of support positions (i.e., the number of elastic bodies) can be reduced to a minimum necessary, and the configuration can be further simplified.

Figure 7:
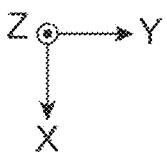
FIG. 7 is a plan view of a lifting unit of an overhead transport vehicle according to a second example embodiment of the present invention.
Figure 8:
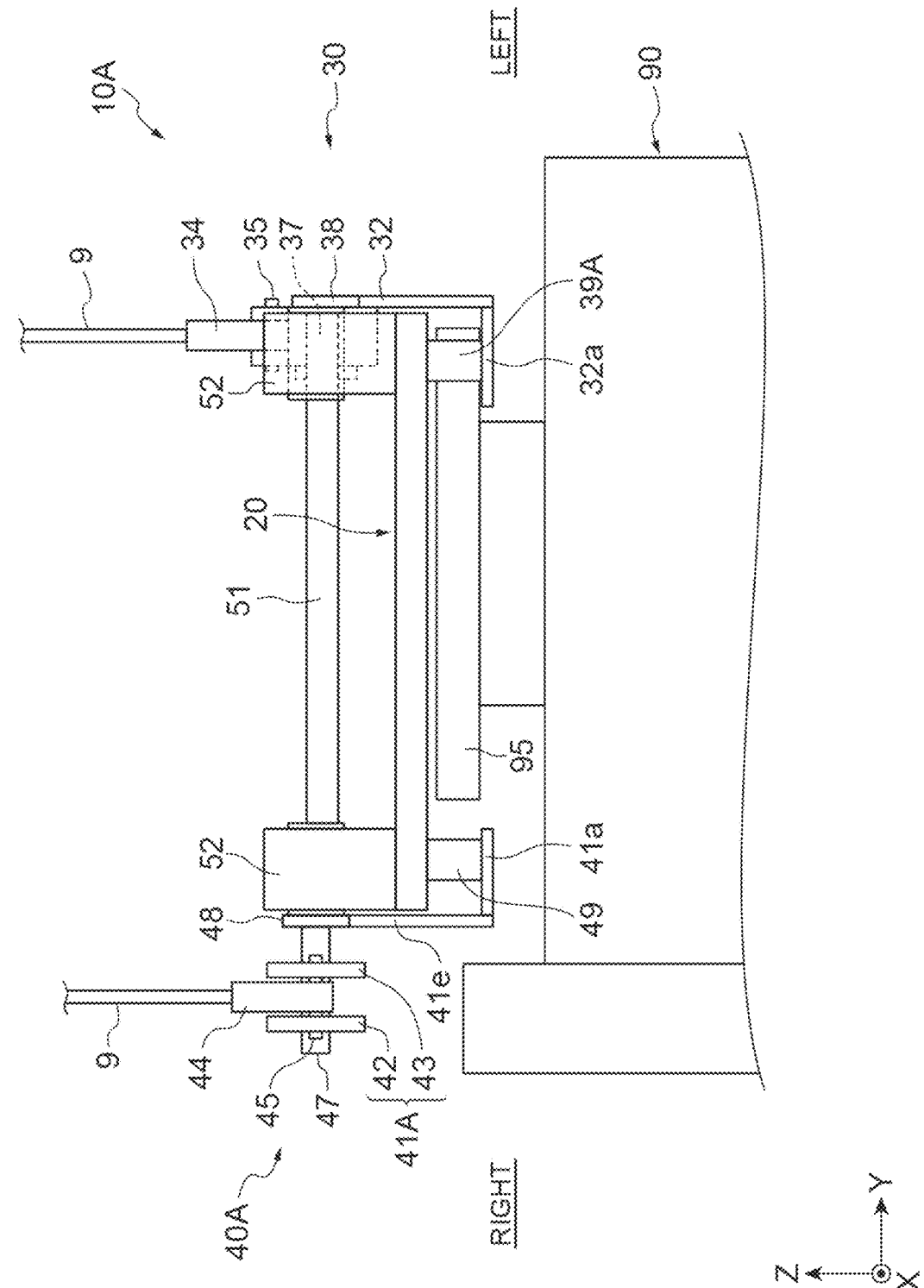
FIG. 8 is a front view of the lifting unit of FIG. 7.
Figure 9:
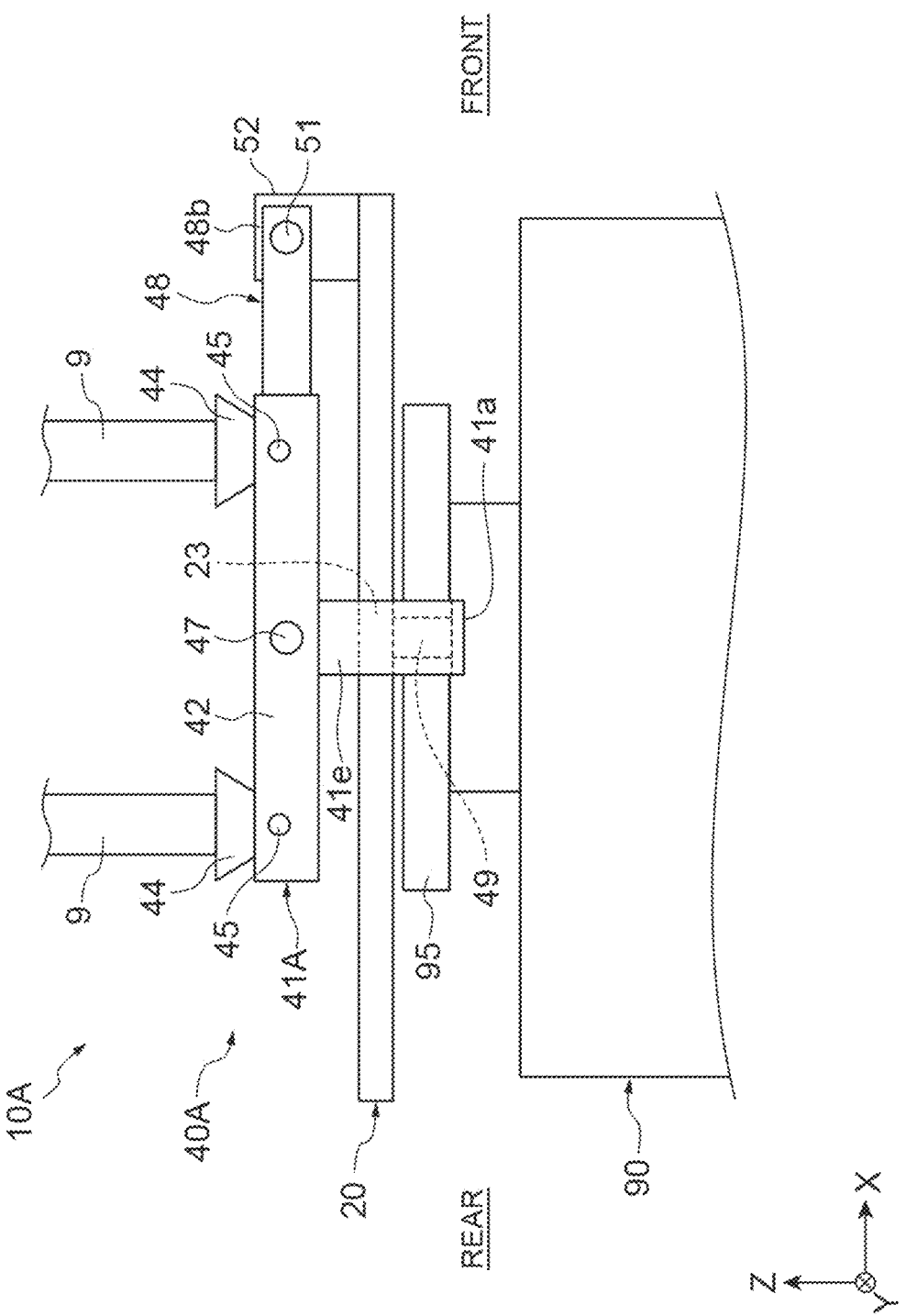
FIG. 9 is a left side view of the lifting unit of FIG. 7.

Although the example embodiments of the present invention have been described above, the present invention is not limited to the above-described example embodiment. For example, as described in FIGS. 7 to 9, a right vibration isolation mechanism 40A in which a right support 41A extending in the front-and-rear direction is attached to the lower ends of the two belts 9, 9, and a lifting unit 10A can also provide the same actions and effects as the lifting unit 10 of the above example embodiment. In the right vibration isolation mechanism 40A, four belts 9 are provided as suspensions, for example. As illustrated in FIG. 8, the right support plate 41a faces the right central portion 23 of the base portion 20 via a hanging portion 41e. The right elastic body 49 is interposed between the right support plate 41a and the right central portion 23. The hanging portion 41e is provided to a position avoiding interference with the FOUP 90. As illustrated in FIG. 7, the right support 41 includes an outer member 42 and an inner member 43 facing parallel to each other in the right-and-left direction and extending in the front-and-rear direction. The outer member 42 and the inner member 43 are made of metal, for example, and can be considered a rigid body. The two clamps 44 are connected to the right support 41A via a connecting shaft 45 extending in the right-and-left direction. In the lifting unit 10A, the number of support positions (for example, three in this example embodiment) at which the base portion 20 is supported via the elastic body is less than the number of suspension positions (for example, four in this example embodiment) at which the left support 31 and the right support 41 are suspended by the belts 9.

Figure 10:
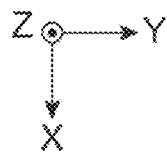
FIG. 10 is a plan view of a lifting unit of an overhead transport vehicle according to a third example embodiment of the present invention.
Figure 11:
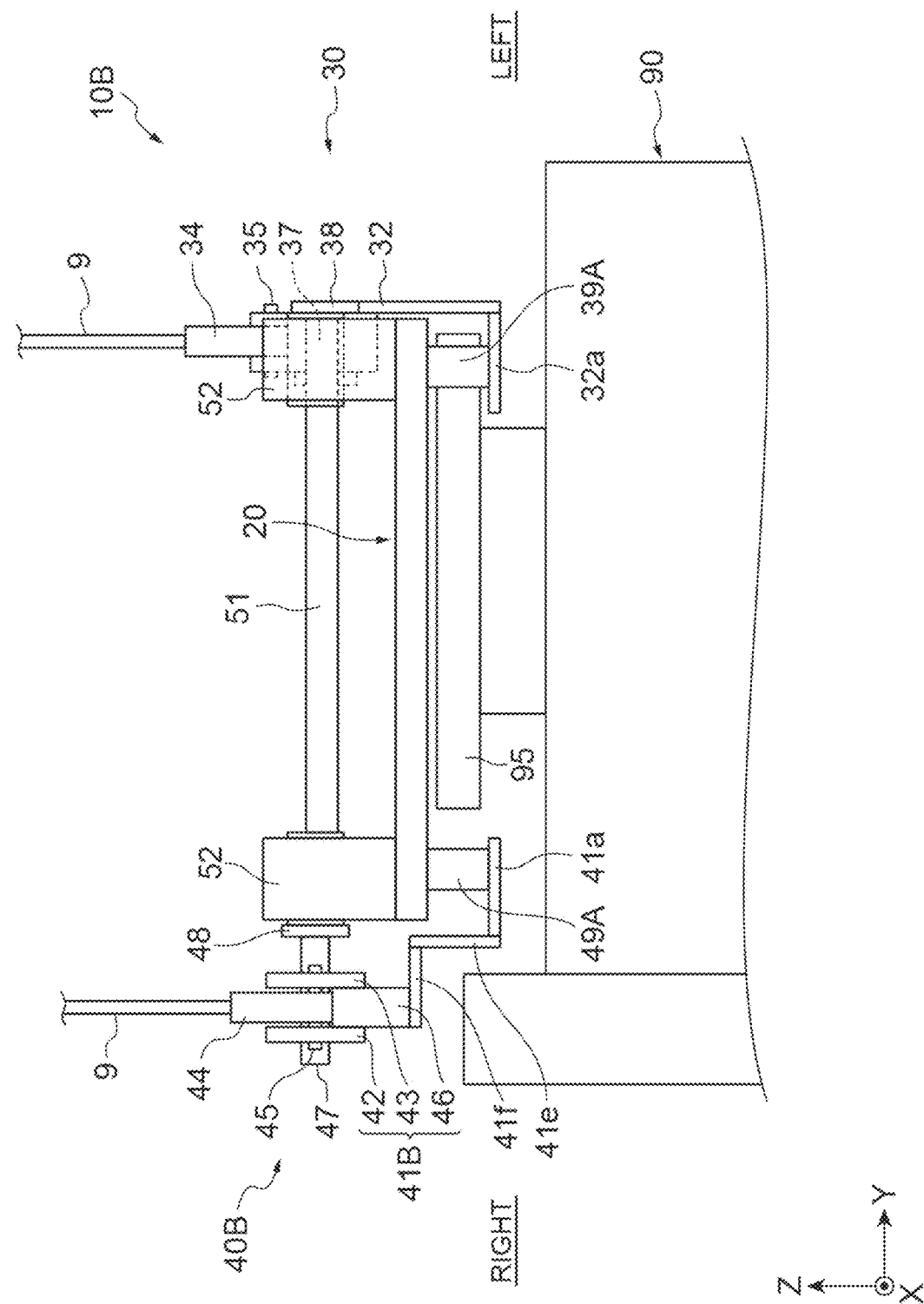
FIG. 11 is a front view of the lifting unit of FIG. 10.
Figure 12:
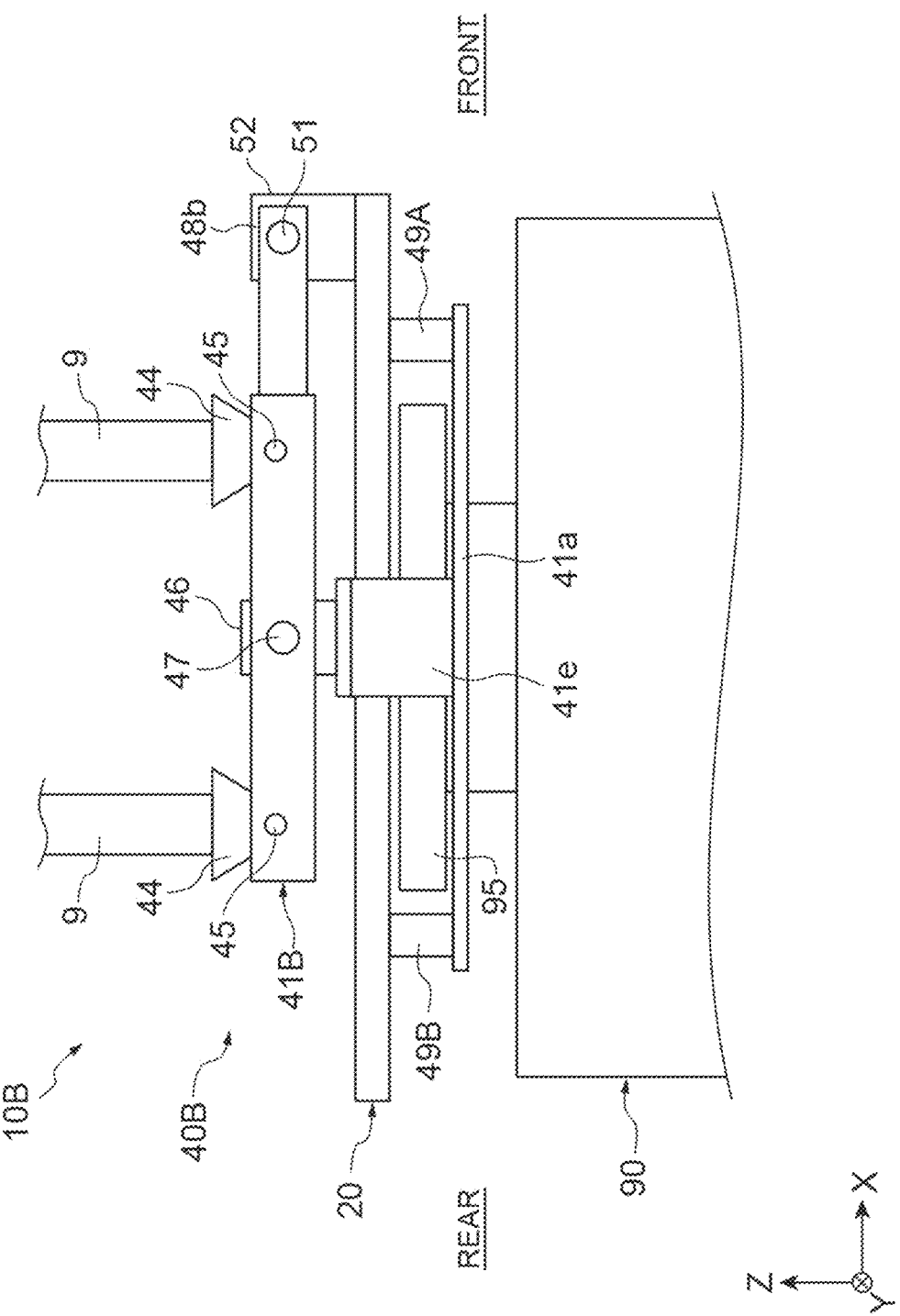
FIG. 12 is a left side view of the lifting unit of FIG. 10.

As described in FIGS. 10 to 12, a right vibration isolation mechanism 40B in which a right support 41B is attached to the lower ends of the two belts 9, 9 via a central body 46, and a lifting unit 10B can also provide the same actions and effects as the lifting section 10 of the above example embodiment. In the right vibration isolation mechanism

40B, the four belts 9 are provided as suspensions. As illustrated in FIG. 11, the right support plate 41a of the right support 41 extending in the front-and-rear direction through the central body 46, a horizontal portion 41f, and the hanging portion 41e, is provided to a position facing a right front portion 24 and a right rear portion 26 of the base portion 20. A right front elastic body 49A and a right rear elastic body 49B are respectively interposed between the right support plate 41a and each of the right front portion 24 and the right rear portion 26. The hanging portion 41e is provided to a position avoiding interference with the FOUP 90.

As a variation, the second end 38b on the front side of the left arm 38 and the second end 48b on the front side of the right arm 48 may be attached to the base portion 20 via the respective second rotation shafts that are separate from each other. Bearings other than the rubber bushes 52 may be used as the bearing of the front rotation shaft 51.

While example embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An overhead transport vehicle comprising:
   a lifter to be raised and lowered by a plurality of suspensions on left and right sides; wherein
   the lifter includes:
   a base portion;
   a left support and a right support attached to lower ends of the suspensions and located on the left and right sides, the left support and the right support each supporting the base portion via an elastic body;
   a left arm bridged between the left support and the base portion; and
   a right arm the right support and the base portion; wherein
   a first end of the left arm is attached to the left support via a first rotation shaft, and a second end of the left arm is attached to the base portion via a second rotation shaft;
   a first end of the right arm is attached to the right support via a third rotation shaft, and a second end of the right arm is attached to the base portion via the second rotation shaft; and
   the first rotation shaft, the second rotation shaft, and the third rotation shaft each extend in a left-right direction.

2. The overhead transport vehicle according to claim 1, wherein the second rotation shaft includes a rubber bush as a bearing.

3. The overhead transport vehicle according to claim 1, wherein a support position at which the base portion is supported via the elastic body is different in plan view from suspension positions at which the left support and the right support are suspended by the suspensions.

4. The overhead transport vehicle according to claim 1, wherein a number of support positions at which the base portion is supported via the elastic body is the same as or less than a number of suspension positions at which the left support and the right support are suspended by the suspensions.

* * * * *